United States Patent
Hsu

(10) Patent No.: US 10,103,748 B2
(45) Date of Patent: Oct. 16, 2018

(54) DECODING METHOD, MEMORY CONTROL CIRCUIT UNIT AND MEMORY STORAGE DEVICE

(71) Applicant: PHISON ELECTRONICS CORP., Miaoli (TW)

(72) Inventor: Pei-Jung Hsu, Kaohsiung (TW)

(73) Assignee: PHISON ELECTRONICS CORP., Miaoli (TW)

( * ) Notice: Subject to any disclaimer, the term of this patent is extended or adjusted under 35 U.S.C. 154(b) by 99 days.

(21) Appl. No.: 14/467,052

(22) Filed: Aug. 25, 2014

(65) Prior Publication Data

US 2016/0011934 A1 Jan. 14, 2016

(30) Foreign Application Priority Data

Jul. 10, 2014 (TW) .............................. 103123834 A

(51) Int. Cl.
*G06F 11/10* (2006.01)
*H03M 13/00* (2006.01)

(52) U.S. Cl.
CPC ......... *H03M 13/00* (2013.01); *G06F 11/1012* (2013.01)

(58) Field of Classification Search
CPC ... G06F 11/1008; G06F 11/1072; G11C 29/00
See application file for complete search history.

(56) References Cited

U.S. PATENT DOCUMENTS

| | | | |
|---|---|---|---|
| 2007/0011601 A1* | 1/2007 | Griseta | G06F 11/1072 714/805 |
| 2013/0031440 A1* | 1/2013 | Sharon | G06F 11/1012 714/758 |
| 2013/0139038 A1* | 5/2013 | Yosoku | H03M 13/1137 714/780 |
| 2014/0143628 A1* | 5/2014 | Li | H03M 13/6591 714/752 |
| 2015/0188570 A1* | 7/2015 | Kwok | G06F 11/1076 714/764 |

* cited by examiner

*Primary Examiner* — Kyle Vallecillo
(74) *Attorney, Agent, or Firm* — JCIPRNET

(57) ABSTRACT

A decoding method, a memory control circuit unit and a memory storage device are provided. The decoding method includes: transmitting a read command sequence for reading a plurality of memory cells in order to obtain a plurality of bits, and obtaining a plurality of reliability information corresponding to each of the bits. The decoding method also includes: calculating a sum of a plurality of reliability information matching a check condition among the plurality of reliability information, and adding a balance information to the sum in order to obtain a weight corresponding to a first bit among the bits and a first syndrome. The decoding method further includes: determining whether the bits have at least one error, and if the bits have the at least one error, executing an iteration decoding procedure according to the weight.

21 Claims, 12 Drawing Sheets

$$\left\{\begin{matrix} 1 & 1 & 1 & 1 & 0 & 0 & 0 & 0 & 0 \\ 1 & 0 & 1 & 1 & 1 & 1 & 1 & 0 & 0 \\ 0 & 1 & 0 & 0 & 1 & 1 & 1 & 1 & 1 \\ 0 & 0 & 1 & 0 & 0 & 1 & 0 & 1 & 1 \end{matrix}\right\}_{900} \begin{Bmatrix} V_1 \\ V_2 \\ V_3 \\ V_4 \\ V_5 \\ V_6 \\ V_7 \\ V_8 \\ V_9 \end{Bmatrix}_{1101} = \begin{Bmatrix} S_1 \\ S_2 \\ S_3 \\ S_4 \end{Bmatrix}_{1105}$$

FIG. 11

$$\overbrace{\phantom{W_{1,1}\ W_{1,2}\ W_{1,3}\ W_{1,4}\ W_{1,5}\ W_{1,6}\ W_{1,7}\ W_{1,8}\ W_{1,9}}}^{n}$$

$$m \left\{ \begin{pmatrix} W_{1,1} & W_{1,2} & W_{1,3} & W_{1,4} & W_{1,5} & W_{1,6} & W_{1,7} & W_{1,8} & W_{1,9} \\ W_{2,1} & W_{2,2} & W_{2,3} & W_{2,4} & W_{2,5} & W_{2,6} & W_{2,7} & W_{2,8} & W_{2,9} \\ W_{3,1} & W_{3,2} & W_{3,3} & W_{3,4} & W_{3,5} & W_{3,6} & W_{3,7} & W_{3,8} & W_{3,9} \\ W_{4,1} & W_{4,2} & W_{4,3} & W_{4,4} & W_{4,5} & W_{4,6} & W_{4,7} & W_{4,8} & W_{4,9} \end{pmatrix} \right.$$

$$[\ V_1\ \ V_2\ \ V_3\ \ V_4\ \ V_5\ \ V_6\ \ V_7\ \ V_8\ \ V_9\ ] \leftarrow 1101$$

$$[\ 0.6\ \ 0.8\ \ -0.2\ \ 1.3\ \ -1.5\ \ 0.3\ \ -1.2\ \ 0.4\ \ 0.1\ ] \leftarrow 1103$$

$$\begin{bmatrix} 1 & 1 & 1 & 1 & 0 & 0 & 0 & 0 & 0 \\ 1 & 0 & 1 & 1 & 1 & 1 & 1 & 0 & 0 \\ 0 & 1 & 0 & 0 & 1 & 1 & 1 & 1 & 1 \\ 0 & 0 & 1 & 0 & 0 & 1 & 0 & 1 & 1 \end{bmatrix} \begin{Bmatrix} S_1 \\ S_2 \\ S_3 \\ S_4 \end{Bmatrix}$$

$$\begin{bmatrix} 8.62 & 6.47 & 48.58 & 3.45 & 0 & 0 & 0 & 0 & 0 \\ 14.18 & 0 & 51.06 & 6.54 & 5.67 & 28.36 & 7.09 & 0 & 0 \\ 0 & 7.51 & 0 & 0 & 4.00 & 20.01 & 5.00 & 15.01 & 94.12 \\ 0 & 0 & 10.68 & 0 & 0 & 7.12 & 0 & 5.34 & 32.72 \end{bmatrix}$$

$$900 \searrow \quad \begin{pmatrix} 1 & 0 & 1 & 1 & 0 & 1 & 0 & 0 & 0 \\ 0 & 1 & 0 & 0 & 1 & 1 & 1 & 1 & 0 \\ 1 & 0 & 0 & 0 & 1 & 1 & 1 & 0 & 1 \\ 0 & 0 & 1 & 1 & 0 & 1 & 0 & 1 & 1 \end{pmatrix}$$

$$1101 \searrow (V_1, V_2, V_3, V_4, V_5, V_6, V_7, V_8, V_9) = \begin{pmatrix} S_1 \\ S_2 \\ S_3 \\ S_4 \end{pmatrix} \swarrow 1105$$

$\underbrace{\begin{matrix} W_{1,1}S_1 & W_{1,2}S_1 & W_{1,3}S_1 & W_{1,4}S_1 & & W_{2,5}S_2 & W_{2,6}S_2 & W_{2,7}S_2 & & \\ + & + & + & + & + & + & + & + & \\ W_{2,1}S_2 & W_{3,2}S_3 & W_{2,3}S_2 & W_{2,4}S_2 & W_{3,5}S_3 & W_{3,6}S_3 & W_{3,7}S_3 & W_{3,8}S_3 & W_{3,9}S_3 \\ & & + & & & + & & + & + \\ & & W_{4,3}S_4 & & & W_{4,6}S_4 & & W_{4,8}S_4 & W_{4,9}S_4 \end{matrix}}_{\text{syndrome weight information}}$

DECODING METHOD, MEMORY CONTROL CIRCUIT UNIT AND MEMORY STORAGE DEVICE

CROSS-REFERENCE TO RELATED APPLICATION

This application claims the priority benefit of Taiwan application serial no. 103123834, filed on Jul. 10, 2014. The entirety of the above-mentioned patent application is hereby incorporated by reference herein and made a part of this specification.

BACKGROUND

Technical Field

The invention relates to a decoding method, and more particularly, to a decoding method, a memory storage device and a memory control circuit unit for a rewritable non-volatile memory module.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, data written in the rewritable non-volatile memory module is encoded according to an error correcting code. The data read from the rewritable non-volatile memory module may be decoded through corresponding decoding procedure. However, a correcting capability of the error correcting code is limited, and a possibility for the errors to occur in the rewritable non-volatile memory module is changed along with operating life of the rewritable non-volatile memory module. Therefore, how to increase the correcting capability and correctness of decoding is one of the major subjects in the industry.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

The invention is directed to a decoding method, a memory control circuit unit and a memory storage device, and capable of effectively improving a correcting capability of decoding.

An exemplary embodiment of the invention provides a decoding method for a rewritable non-volatile memory module having a plurality of memory cells, and the decoding method includes the following steps. A read command sequence is transmitted, wherein the read command sequence is configured to read the memory cells in order to obtain a plurality of bits. A plurality of reliability information is obtained, wherein each of the reliability information is corresponding to one of the bits. A sum of a plurality of reliability information matching a check condition among the reliability information is calculated. A balance information is added to the sum in order to obtain a weight, wherein the weight is corresponding to a first bit among the bits and a first syndrome. Whether the bits have at least one error is determined. If the bits have the at least one error, an iteration decoding procedure is executed according to the weight.

An exemplary embodiment of the invention provides a memory control circuit unit for controlling a rewritable non-volatile memory module, in which the rewritable non-volatile memory module has a plurality of memory cells. The memory control circuit unit includes a host interface, a memory interface, a memory management circuit and an error checking and correcting circuit. The host interface is configured to couple to a host system. The memory interface is used for coupling to the rewritable non-volatile memory module. The memory management circuit is coupled to the host interface and the memory interface and configured to transmit a read command sequence, wherein the read command sequence is configured to read the memory cells in order to obtain a plurality of bits. The error checking and correcting circuit is coupled to the memory management circuit and configured to obtain a plurality of reliability information, wherein each of the reliability information is corresponding to one of the bits. Herein, the error checking and correcting circuit is configured to calculate a sum of the reliability information matching a check condition among the reliability information and add a balance information to the sum in order to obtain a weight, which is corresponding to a first bit among the bits and a first syndrome. In addition, the error checking and correcting circuit is further configured to determine whether the bits have at least one error. If the bits have the at least one error, the error checking and correcting circuit is further configured to execute an iteration decoding procedure according to the weight.

An exemplary embodiment of the invention provides a memory storage device, which includes a connection interface unit, a rewritable non-volatile memory module and a memory control circuit unit. The rewritable non-volatile memory module includes a plurality of memory cells. The connection interface unit is configured to couple to a host system. The memory control circuit unit is coupled to the connection interface and the rewritable non-volatile memory module and configured to transmit a read command sequence, wherein the read command sequence is configured to read the memory cells in order to obtain a plurality of bits. Herein, the memory control circuit unit is further configured to obtain a plurality of reliability information, wherein each of the reliability information is corresponding to one of the bits. In addition, the memory control circuit unit is configured to calculate a sum of the reliability information matching a check condition among the reliability information and add a balance information to the sum in order to obtain a weight, which is corresponding to a first bit among the bits and a first syndrome. The memory control circuit unit is further configured to determine whether the bits have at least one error. If the bits have the at least one error, the memory control circuit unit is further configured to execute an iteration decoding procedure according to the weight.

Based on above, when the bit read from the rewritable non-volatile memory module includes the error, an exemplary embodiment of the invention is capable of calculating the syndrome weight information according to the weight corresponding to each bit and thereby deciding which bit is to be updated. Particularly, the decoding method, the memory control circuit unit and the memory storage device provided according to the exemplary embodiments of the invention are capable of calculating the weight of each bit according to the sum of the reliability information corresponding to each bit, the smallest value among the values of the reliability information not corresponding to the currently calculated bit, and the reliability information corresponding to the currently calculated bit in each of the constraints. Accordingly, the correcting capability of decoding may be effectively improved.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 11 is a schematic diagram illustrating a matrix multiplication according to an exemplary embodiment of the invention.

FIG. 12 is a schematic diagram illustrating a weight matrix according to an exemplary embodiment of the invention.

FIG. 13 is a schematic diagram illustrating correspondence relationships of the codeword, the reliability information, the parity check matrix and the syndromes according to an exemplary embodiment of the invention.

FIG. 14 is a schematic diagram illustrating the calculated weight according to an exemplary embodiment of the invention.

FIG. 15 is a schematic diagram illustrating a matrix multiplication according to an exemplary embodiment of the invention.

FIG. 16 is a schematic diagram illustrating a syndrome weight information according to an exemplary embodiment of the invention.

DESCRIPTION OF THE EMBODIMENTS

Figure 1:
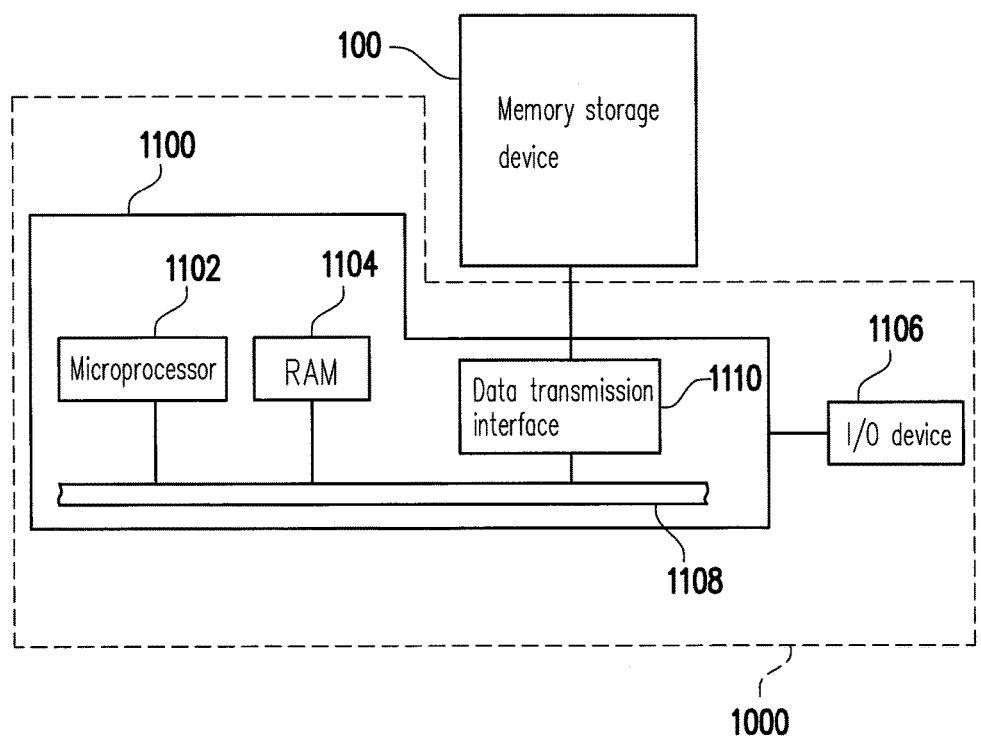
FIG. 1 is a schematic diagram illustrating a host system and a memory storage device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

Generally, a memory storage device (also known as a memory storage system) includes a rewritable non-volatile memory module and a controller (also known as a control circuit). The memory storage device is usually configured together with a host system so that the host system may write data to or read data from the memory storage device.

Figure 2:
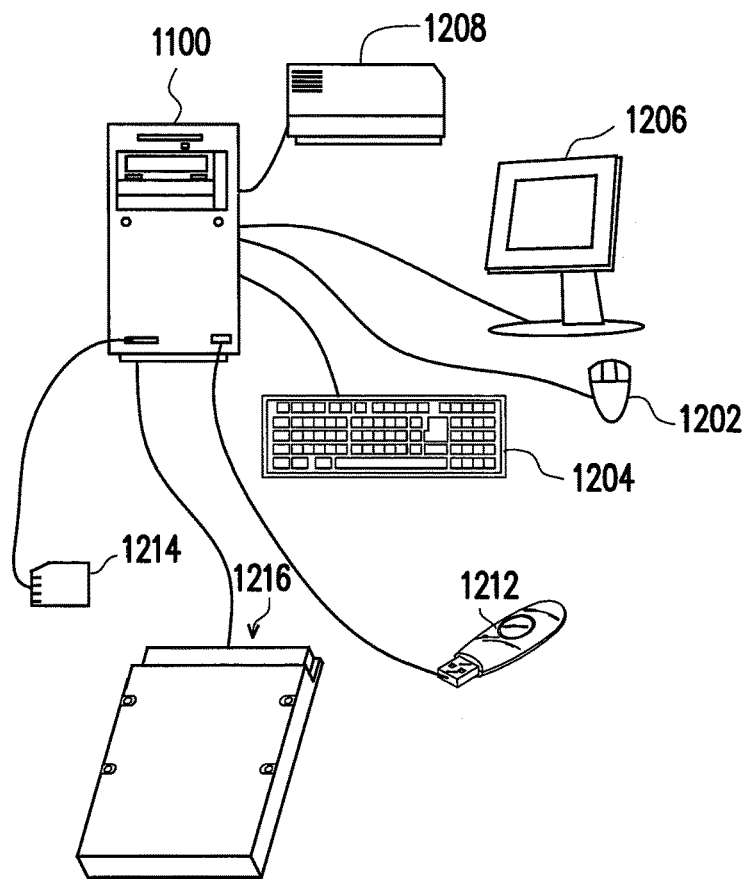
FIG. 2 is a schematic diagram of a computer, an input/output device, and a memory storage device according to an exemplary embodiment of the invention.

FIG. 1 is a schematic diagram illustrating a host system and a memory storage device according to an exemplary embodiment of the invention. FIG. 2 is a schematic diagram of a computer, an input/output device, and a memory storage device according to an exemplary embodiment of the invention.

Referring to FIG. 1, a host system 1000 includes a computer 1100 and an input/output (I/O) device 1106. The computer 1100 includes a microprocessor 1102, a random access memory (RAM) 1104, a system bus 1108, and a data transmission interface 1110. For example, the I/O device 1106 includes a mouse 1202, a keyboard 1204, a display 1206 and a printer 1208 as shown in FIG. 2. It should be understood that the devices illustrated in FIG. 2 are not intended to limit the I/O device 1106, and the I/O device 1106 may further include other devices.

In an exemplary embodiment, the memory storage device 100 is coupled to other devices of the host system 1000 through the data transmission interface 1110. By using the microprocessor 1102, the random access memory 1104 and the Input/Output (I/O) device 1106, data may be written into the memory storage device 100 or may be read from the memory storage device 100. For example, the memory storage device 100 may be a rewritable non-volatile memory storage device such as a flash drive 1212, a memory card 1214, or a solid state drive (SSD) 1216 as shown in FIG. 2.

Figure 3:
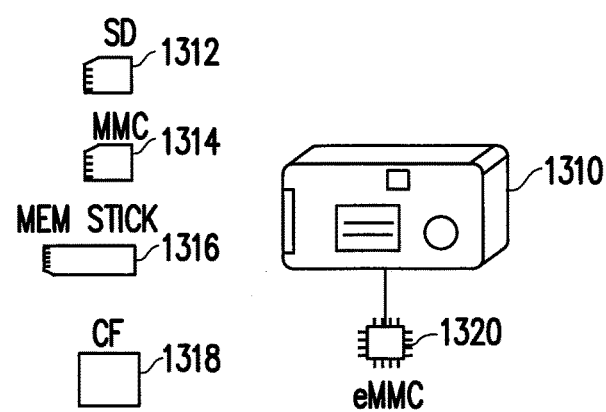
FIG. 3 is a schematic diagram illustrating a host system and a memory storage device according to an exemplary embodiment of the invention.

FIG. 3 is a schematic diagram illustrating a host system and a memory storage device according to an exemplary embodiment of the invention.

Generally, the host system 1000 may substantially be any system capable of storing data with the memory storage device 100. Although the host system 1000 is described by using a computer system in the present exemplary embodiment, in another exemplary embodiment, the host system 1000 may be a digital camera, a video camera, a telecommunication device, an audio player, or a video player. For example, when the host system is a digital camera (video camera) 1310, the rewritable non-volatile memory storage device may be a SD card 1312, a MMC card 1314, a memory stick 1316, a CF card 1318 or an embedded storage device 1320 (as shown in FIG. 3). The embedded storage device 1320 includes an embedded MMC (eMMC). It should be mentioned that the eMMC is directly coupled to a substrate of the host system.

Figure 4:
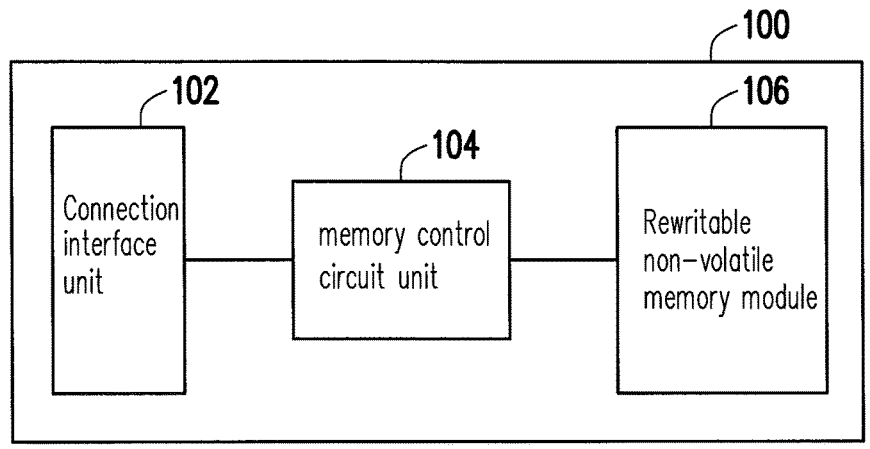
FIG. 4 is a schematic block diagram illustrating the memory storage device in FIG. 1.

FIG. 4 is a schematic block diagram illustrating the memory storage device in FIG. 1.

Referring to FIG. 4, the memory storage device 100 includes a connection interface unit 102, a memory control circuit unit 104 and a rewritable non-volatile memory storage module 106.

In the present exemplary embodiment, the connection interface unit 102 is compatible with a serial advanced technology attachment (SATA) standard. However, the invention is not limited thereto, and the connection interface unit 102 may also be compatible with a Parallel Advanced Technology Attachment (PATA) standard, an Institute of Electrical and Electronic Engineers (IEEE) 1394 standard, a peripheral component interconnect (PCI) Express interface standard, a universal serial bus (USB) standard, a secure digital (SD) interface standard, a Ultra High Speed-I (UHS-I) interface standard, a Ultra High Speed-II (UHS-II) interface standard, a memory sick (MS) interface standard, a multi media card (MMC) interface standard, an embedded MMC (eMMC) interface standard, a Universal Flash Storage (UFS) interface standard, a compact flash (CF) interface standard, an integrated device electronics (IDE) interface standard or other suitable standards. The connection interface unit 102 and the memory control circuit unit 104 may be packaged into one chip, or the connection interface unit 102 is disposed outside of a chip containing the memory control circuit unit 104.

The memory control circuit unit 104 is configured to execute a plurality of logic gates or control commands which are implemented in a hardware form or in a firmware form, so as to perform operations of writing, reading or erasing data in the rewritable non-volatile memory storage module 106 according to the commands of the host system 1000.

The rewritable non-volatile memory storage module 106 is coupled to the memory control circuit unit 104 and configured to store data written from the host system 1000. The rewritable non-volatile memory module 106 may be a Single Level Cell (SLC) NAND flash memory module, a Multi Level Cell (MLC) NAND flash memory module (i.e., a flash memory module capable of storing two bits of data in one memory cell), a Triple Level Cell (TLC) NAND flash memory module (i.e., a flash memory module capable of storing three bits of data in one memory cell), other flash memory modules or any memory module having the same features.

Figure 5:
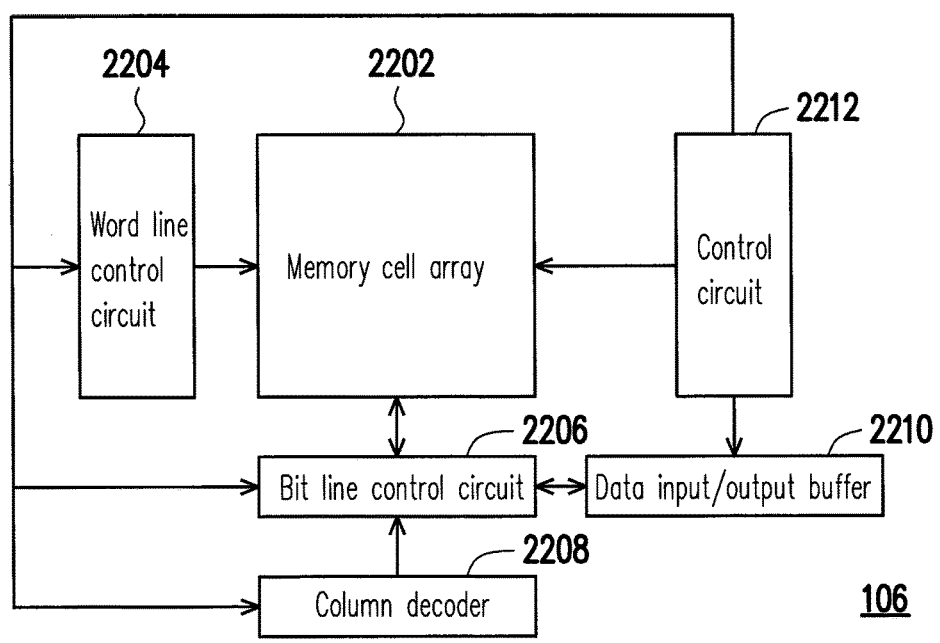
FIG. 5 is a schematic block diagram illustrating a rewritable non-volatile memory module according to an exemplary embodiment of the invention.
Figure 6:
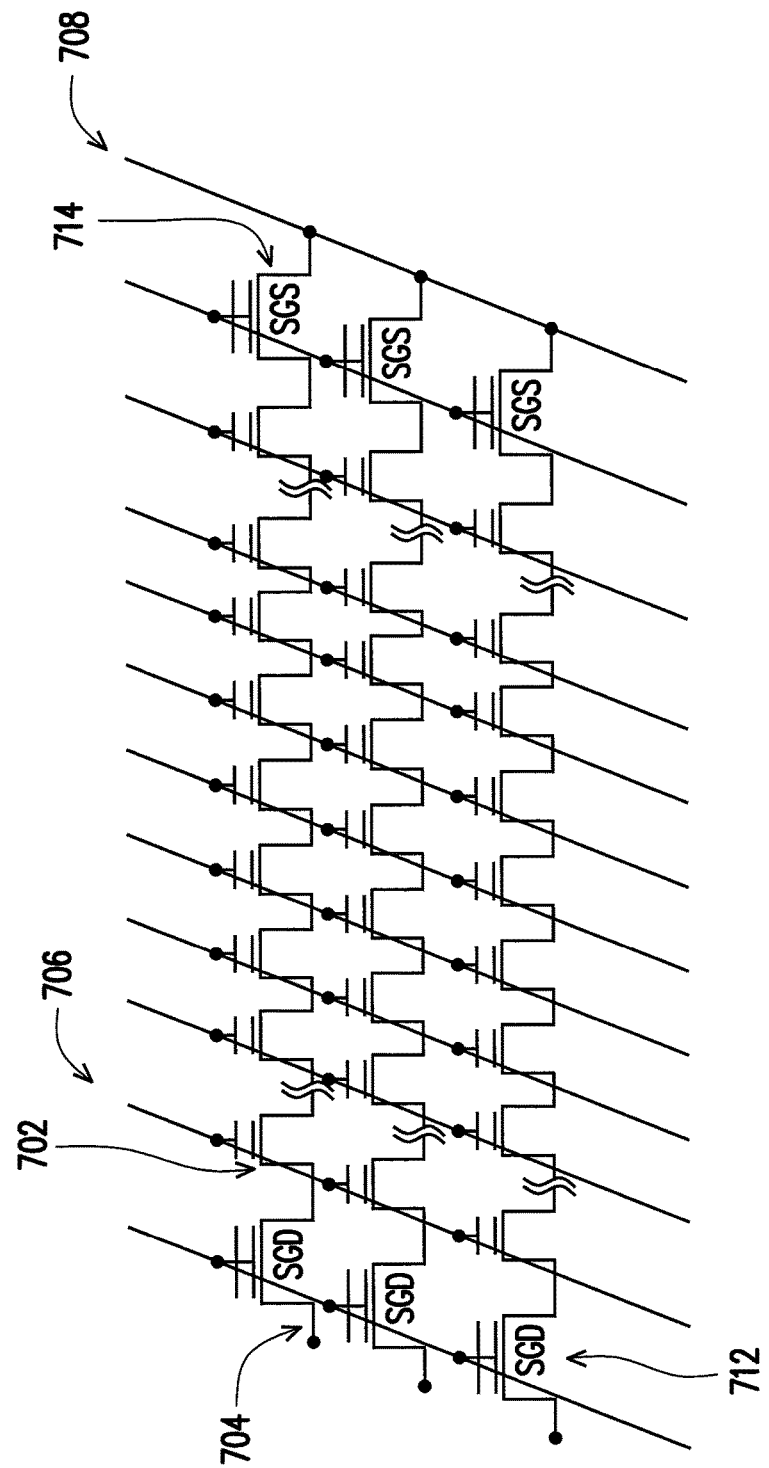
FIG. 6 is a schematic diagram illustrating a memory cell array according to an exemplary embodiment of the invention.

FIG. 5 is a schematic block diagram illustrating a rewritable non-volatile memory module according to an exemplary embodiment of the invention. FIG. 6 is a schematic diagram illustrating a memory cell array according to an exemplary embodiment of the invention.

Referring to FIG. 5, the rewritable non-volatile memory module 106 includes a memory cell array 2202, a word line control circuit 2204, a bit line control circuit 2206, a column decoder 2208, a data input-output buffer 2210 and a control circuit 2212.

In the present exemplary embodiment, the memory cell array 2202 may include a plurality of memory cells 702 used to store data, a plurality of select gate drain (SGD) transistors 712, a plurality of select gate source (SGS) transistors 714, as well as a plurality of bit lines 704, a plurality of word lines 706, a common source line 708 connected to the memory cells (as shown in FIG. 6). The memory cell 702 is disposed at intersections of the bit lines 704 and the word lines 706 in a matrix manner (or in a 3D stacking manner). When a writing command or a reading command is received from the memory control circuit unit 104, the control circuit 2212 controls the word line control circuit 2204, the bit line control circuit 2206, the column decoder 2208, the data input-output buffer 2210 to write the data in the memory cell array 2202 or read the data from the memory cell array 2202. Therein, the word line control circuit 2204 is configured to control voltages applied to the word lines 706; the bit line control circuit 2206 is configured to control voltages applied to the bit lines 704; the column decoder 2208 is configured to select the corresponding bit line according to a row address in a command; and the data input-output buffer 2210 is configured to temporarily store the data.

Each of the memory cells in the rewritable non-volatile memory module 106 may store one or more bits by changing a threshold voltage of the memory cell. More specifically, in each of the memory cells, a charge trapping layer is provided between a control gate and a channel Amount of electrons in the charge trapping layer may be changed by applying a write voltage to the control gate thereby changing the threshold voltage of the memory cell. This procedure of changing the threshold voltage is also known as "writing data into the memory cell" or "programming the memory cell". Each of the memory cells in the memory cell array 2022 has a plurality of storage statuses depended on changes in the threshold voltage. Moreover, which of the storage statuses is the memory cell belong to may be determined by reading voltages, so as to obtain the one or more bits stored in the memory cell.

Figure 7:
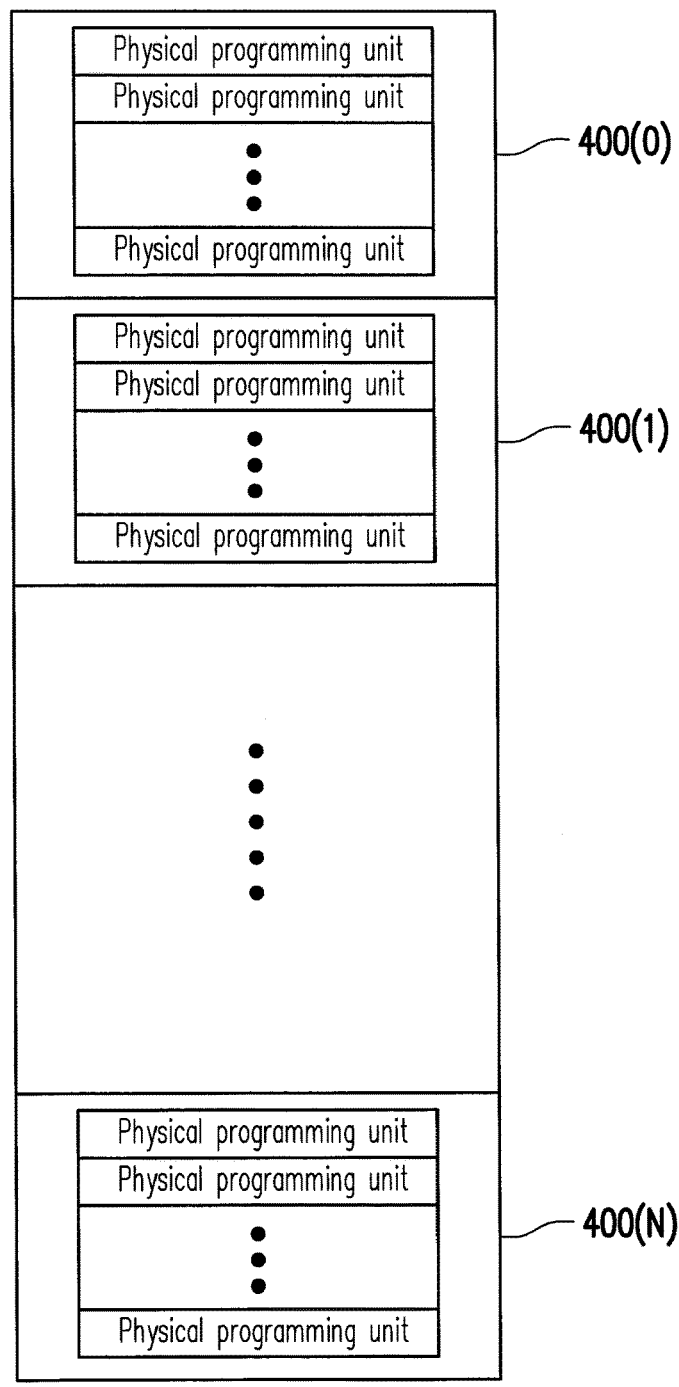
FIG. 7 is a schematic diagram illustrating management of a rewritable non-volatile memory module according to an exemplary embodiment of the invention.

FIG. 7 is a schematic diagram illustrating management of a rewritable non-volatile memory module according to an exemplary embodiment of the invention.

Referring to FIG. 7, the memory cells 702 of the rewritable non-volatile memory module 106 constitute a plurality of physical programming units, and the physical programming units constitutes a plurality of physical erasing units 400(0) to 400(N). Specifically, the memory cells on the same word line constitute one or more of the physical programming units. If each of the memory cells can store more than two bits, the physical programming units on the same word line can be classified into a lower physical programming unit and an upper physical programming unit. For instance, the LSB of each memory cell is belonging to the lower physical programming unit, and the MSB of each memory cell is belonging to the upper physical programming unit. Generally, in the MLC NAND flash memory, a writing speed of the lower physical programming unit is faster than a writing speed of the upper physical programming unit, or a reliability of the lower physical programming unit is higher than a reliability of the upper physical programming unit. In this present exemplary embodiment, the physical programming unit is a minimum unit for programming. That is, the physical programming unit is the minimum unit for writing data. For example, the physical programming unit is a physical page or a physical sector. If the physical programming unit is the physical page, each physical programming unit usually includes a data bit area and a redundancy bit area. The data bit area has multiple physical sectors configured to store user data, and the redundant bit area is configured to store system data (e.g., an error correcting code). In the present exemplary embodiment, each of the data bit areas contains 32 physical sectors, and a size of each physical sector is 512-byte (B). However, in other exemplary embodiments, the data bit area may also include 8, 16, or more or less of the physical sectors, and amount and sizes of the physical sectors are not limited in the invention. On the other hand, the physical erasing unit is the minimal unit for erasing. Namely, each physical erasing unit contains the least number of memory cells to be erased together. For instance, the physical erasing unit is a physical block.

Figure 8:
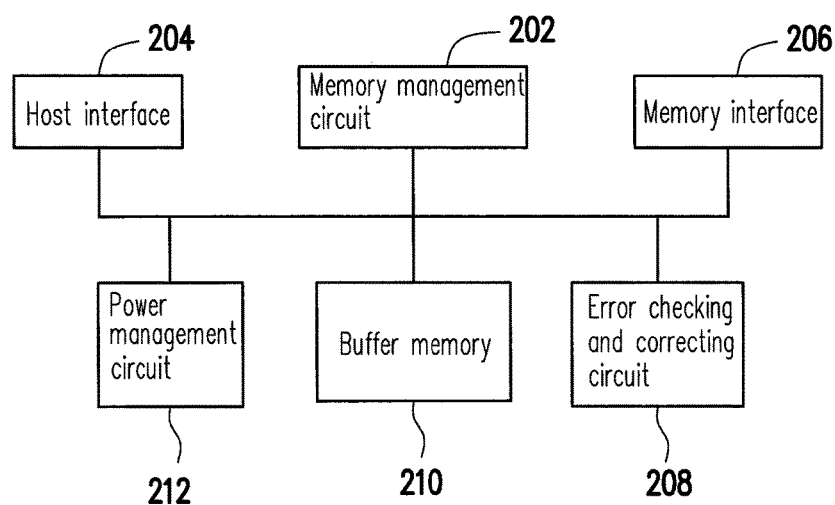
FIG. 8 is a schematic block diagram illustrating a memory control circuit unit according to an exemplary embodiment of the invention.

FIG. 8 is a schematic block diagram illustrating a memory control circuit unit according to an exemplary embodiment of the invention.

Referring to FIG. 8, the memory control circuit unit 104 includes a memory management circuit 202, a host interface 204, a memory interface 206 and an error checking and correcting circuit 208.

The memory management circuit 202 is configured to control overall operations of the memory control circuit unit 104. Specifically, the memory management circuit 202 has a plurality of control commands. During operations of the memory storage device 100, the control commands are executed to perform various operations such as writing, reading and erasing data. Operations of the memory management circuit 202 are similar to the operations of the memory control circuit unit 104, thus related description is omitted hereinafter.

In the present exemplary embodiment, the control commands of the memory management circuit 202 are implemented in a form of a firmware. For instance, the memory management circuit 202 has a microprocessor unit (not illustrated) and a ROM (not illustrated), and the control commands are burned into the ROM. When the memory storage device 100 operates, the control commands are executed by the microprocessor to perform operations of writing, reading or erasing data.

In another exemplary embodiment, the control commands of the memory management circuit 202 may also be stored as program codes in a specific area (for example, the system area in a memory exclusively used for storing system data) of the rewritable non-volatile memory module 106. In addition, the memory management circuit 202 has a microprocessor unit (not illustrated), a ROM (not illustrated) and a RAM (not illustrated). More particularly, the ROM has a boot code, which is executed by the microprocessor unit to load the control commands stored in the rewritable non-volatile memory module 106 to the RAM of the memory management circuit 202 when the memory control circuit unit 104 is enabled. Next, the control commands are executed by the microprocessor unit to perform operations of writing, reading or erasing data.

Further, in another exemplary embodiment, the control commands of the memory management circuit 202 may also be implemented in a form of hardware. For example, the memory management circuit 202 includes a microcontroller, a memory writing unit, a memory reading unit, a memory erasing unit and a data processing unit. The memory management unit, the memory writing unit, the memory reading unit, the memory erasing unit and the data processing unit are coupled to the microprocessor. The memory management unit is configured to manage the physical erasing units of the rewritable non-volatile memory module 106; the memory writing unit is configured to issue a write command to the rewritable non-volatile memory module 106 in order to write data to the rewritable non-volatile memory module; the memory reading unit is configured to issue a read command to the rewritable non-volatile memory module 106 in order to read data from the rewritable non-volatile memory module 106; the memory erasing unit is configured to issue an erase command to the rewritable non-volatile memory module 106 in order to erase data from the rewritable non-volatile memory module 106; the data processing unit is configured to process both the data to be written to the rewritable non-volatile memory module 106 and the data to be read from the rewritable non-volatile memory module 106.

The host interface 204 is coupled to the memory management circuit 202 and configured to receive and identify commands and data sent from the host system 1000. Namely, the commands and data sent from the host system 1000 are passed to the memory management circuit 202 through the host interface 204. In the present exemplary embodiment, the host interface 204 is compatible to a SATA standard. However, it should be understood that the present invention is not limited thereto, and the host interface 204 may also be compatible with a PATA standard, an IEEE 1394 standard, a PCI Express standard, a USB standard, a SD standard, a UHS-I standard, a UHS-II standard, a MS standard, a MMC standard, a eMMC standard, a UFS standard, a CF standard, an IDE standard, or other suitable standards for data transmission.

The memory interface 206 is coupled to the memory management circuit 202 and configured to access the rewritable non-volatile memory module 106. That is, data to be written to the rewritable non-volatile memory module 106 is converted to a format acceptable to the rewritable non-volatile memory module 106 through the memory interface 206.

The error checking and correcting circuit 208 is coupled to the memory management circuit 202 and configured to execute an error checking and correcting process to ensure the correctness of data. Specifically, when the memory management circuit 202 receives the writing command from the host system 1000, the error checking and correcting circuit 208 generates an error correcting code (ECC) and/or an error detecting code (EDC) for data corresponding to the writing command, and the memory management circuit 202 writes data and the ECC and/or the EDC corresponding to the writing command to the rewritable non-volatile memory module 106. Subsequently, when the memory management circuit 202 reads the data from the rewritable non-volatile memory module 106, the corresponding ECC and/or the EDC is also read from the rewritable non-volatile memory module 106, and the error checking and correcting circuit 208 executes the error checking and correcting procedure for the read data based on the ECC and/or the EDC.

In an exemplary embodiment, the memory control circuit unit 104 further includes a buffer memory 210 and a power management circuit 212.

The buffer memory 210 is coupled to the memory management circuit 202 and configured to temporarily store data and commands from the host system 1000 or data from the rewritable non-volatile memory module 106.

The power management unit 212 is coupled to the memory management circuit 202 and configured to control a power of the memory storage device 100.

In this exemplary embodiment, a low density parity code (LDPC) is used by the error checking and correcting circuit 208. However, in another exemplary embodiment, the error checking and correcting circuit 208 may also use a BCH code, a convolutional code, a turbo code, but the invention is not limited thereto.

In this exemplary embodiment, the error checking and correcting circuit 208 encodes and decodes according to a low density parity check algorithm. In the low density parity code, a valid codeword is defined by a parity check matrix. The parity check matrix is marked as a matrix H and a codeword is marked as CW hereinafter. According to an equation (1) below, if a result calculated by multiplying the parity check matrix H by the codeword CW is a zero vector, it indicates that the codeword CW is the valid codeword. Therein, an operator $\otimes$ represents a mod 2 matrix multiplication. In other words, a null space of the matrix H includes all the valid codewords. However, a content of the codeword CW is not particularly limited in the invention. For instance, the codeword CW may also include the error correcting code or the error detecting code generated by using any algorithm.

$$H \otimes CW^T = 0 \qquad (1)$$

Therein, a dimension of the matrix H is m-by-n, and a dimension of the codeword CW is 1-by-n. m and n are positive integers. The codeword CW includes message bits and parity bits. Namely, the codeword CW may be represented by [M P], in which a vector M is constituted by the message bits, and a vector P is constituted by the parity bits. A dimension of the vector M is 1-by-(n−m), and a dimension of the vector P is 1-by-m. Hereinafter, the message bits and the parity bits are collectively known as data bits. In other words, the codeword CW includes n bits, in which a length of the message bits is (n−m) bits, and a length of the parity bits is m bits. Namely, a code rate of the codeword CW is (n−m)/n.

Generally, a generation matrix (marked as G hereinafter) is used during decoding, so that an equation (2) below may be satisfied by arbitrary values of the vector M. Therein, a dimension of the generation matrix G is (n−m)-by-n.

$$M \otimes G = [M\ P] = CW \qquad (2)$$

Therein, the codeword CW generated by the equation (2) is the valid codeword. Therefore, when the equation (2) is substituted into the equation (1), an equation (3) below may be obtained accordingly.

$$H \otimes G^T \otimes M^T = 0 \qquad (3)$$

Since the vector M may be arbitrary values, an equation (4) below may definitely be satisfied. In other words, after the parity check matrix H is decided, the corresponding generation matrix G may also be decided.

$$H \otimes G^T = 0 \qquad (4)$$

When decoding the codeword CW, a parity check procedure is first executed on the data bits in the codeword. For instance, the parity check matrix H may be multiplied by the codeword CW to generate a vector (hereinafter, marked as S, as shown in an equation (5) below). If the vector S is the zero vector, the codeword CW may be directly outputted. If the vector S is not the zero vector, it indicates that the codeword CW is not the valid codeword.

$$H \otimes CW^T = S \qquad (5)$$

A dimension of the vector S is m-by-1, in which each element is also known as a syndrome. If the codeword CW is not the valid codeword, the error checking and correcting circuit 208 may execute a decoding procedure for attempting to correct an error bit in the codeword CW. In an exemplary embodiment, the decoding procedure executed by the error checking and correcting circuit 208 is an iteration decoding procedure. In other words, the decoding procedure is repeatedly executed until the codeword is successfully decoded or a number of executions reaches a preset threshold.

Figure 9:
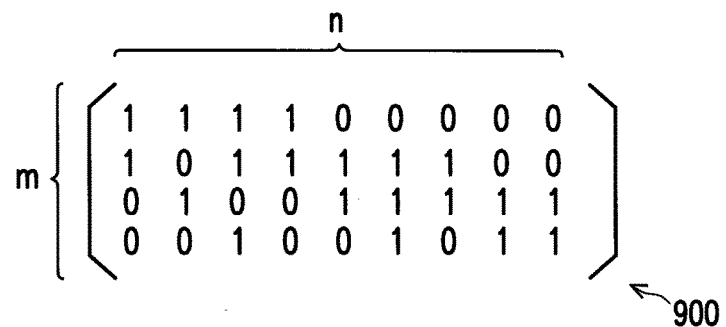
FIG. 9 is a schematic diagram illustrating a parity check matrix according to an exemplary embodiment of the invention.

FIG. 9 is a schematic diagram illustrating a parity check matrix according to an exemplary embodiment of the invention.

Referring to FIG. 9, a dimension of a parity check matrix 900 is 4-by-9, but values of the positive integers m and n are not particularly limited in the invention. Each row in the parity check matrix 900 also indicates a constraint. For example, a first row to a fourth row of the parity check matrix 900 indicate a first constraint to a fourth constraint, respectively. Each constraint in the parity check matrix 900 includes a plurality of elements. Take the first row of the parity check matrix 900 (i.e., the first constraint) as an example, in case that one codeword is the valid codeword, a bit "0" can be obtained after performing a modulo-2 addition on first, second, third and fourth bits in the codeword. Persons skilled in the art should be able to understand how to encode by using the parity check matrix 900, and thus related description is omitted hereinafter. In addition, the parity check matrix 900 is merely a sample matrix instead of limitation to the invention.

When the memory management circuit 202 writes a plurality of bits to the rewritable non-volatile memory module 106, the error checking and correcting circuit 208 may correspondingly generate m parity bits for each (n−m) bits to be written (i.e., information bits). Subsequently, the memory management circuit 202 writes n bits as one codeword into the rewritable non-volatile memory module 106.

Figure 10:
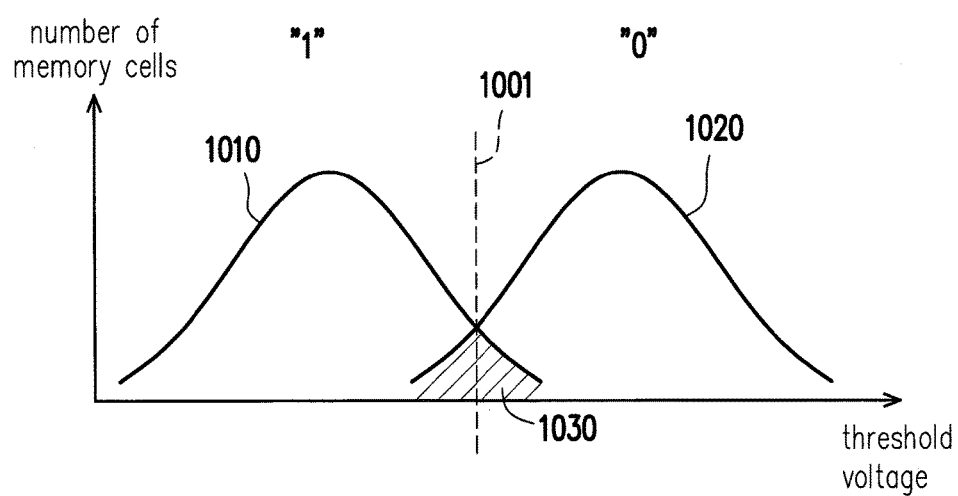
FIG. 10 is a schematic diagram illustrating distributions of threshold voltages of the SLC-type flash memory module according to an exemplary embodiment of the invention.

FIG. 10 is a schematic diagram illustrating distributions of threshold voltages of the SLC-type flash memory module according to an exemplary embodiment of the invention.

Referring to FIG. 10, a horizontal axis represents the threshold voltages of the memory cells, and a vertical axis represents a number of the memory cells. For instance, FIG. 10 illustrates the threshold voltage of each memory cell in one specific physical programming unit. It is assumed that, when the threshold voltage of a specific memory cell falls in a distribution 1010, the bit stored in the memory cell is the bit "1". Otherwise, when the threshold voltage of the specific memory cell falls in a distribution 1020, the bit stored in the memory cell is the bit "0". It is worth mentioning that, the present exemplary embodiment takes a SLC-type flash memory module for example, thus there are two possible distributions for the threshold voltages. However, in other exemplary embodiments, the threshold voltage can include four, eight or any number of distributions, and a reading voltage can fall between any two distributions. In addition, the bit represented by each distribution is not particularly limited in the invention.

When it is intended to read the data from the rewritable non-volatile memory module 106, the memory management circuit 202 transmits a read command sequence to the rewritable non-volatile memory module 106. The read command sequence includes one or more commands or program codes and is configured to instruct for reading a plurality of memory cells in one physical programming unit in order to obtain a plurality of bits. For example, a plurality of memory cells in one physical programming unit are read according to a reading voltage 1001. If the threshold voltage of a specific memory cell is less than the reading voltage, the memory cell is then turned on, and the bit "1" is read by the memory management circuit 202. Otherwise, if the threshold voltage of the specific memory cell is greater than the reading voltage, the memory cell is not turned on, and the bit "0" is read by the memory management circuit 202.

It should be noted that, a distribution 1010 and a distribution 1020 include an overlap region 1030. The overlap region 1030 indicates that some of the memory cells are supposed to store the bit "1" (which belongs to the distribution 1010) yet having the threshold voltages thereof being greater than the reading voltage 1001; Alternatively, some of the memory cells are supposed to store the bit "0" (which belongs to the distribution 1020) while having the threshold voltages being less than the reading voltage 1001. In other words, a part of bits among all the bits being read may have errors. In another exemplary embodiment, a plurality of bits may also be read from one memory cell, and the invention is not limited thereto. In addition, one reading may refer to reading of a plurality of memory cells in a physical sector or any number of the memory cells, which is not particularly limited in the invention.

In this exemplary embodiment, when the memory management circuit 202 reads n bits (which forms one codeword) from the rewritable non-volatile memory module 106, the memory management circuit 202 may also obtain a reliability information corresponding to each of the bits. Herein, the reliability information are used to indicate a probability (or also known as a reliance level) for one specific bit to be decoded into "1" or "0". Particularly, when different algorithms are adopted, a value of the obtained reliability information corresponding to each of the bits may also be different. For instance, the error checking and correcting circuit 208 may adopt a Sum-Product Algorithm, a Min-Sum Algorithm, or a bit-flipping Algorithm, but the adopted algorithm is not particularly limited in the invention.

The error checking and correcting circuit 208 determines whether the bits have at least one error. For example, in the present exemplary embodiment, the error checking and correcting circuit 208 executes a parity checking procedure on the bits to obtain a plurality of syndromes, wherein each of the bits is corresponding to at least one of the syndromes. In other words, the syndromes may constitute aforesaid vector S. In an exemplary embodiment, the vector S is also known as a syndrome vector. The error checking and correcting circuit 208 may determine whether the bits have at least one error according to the syndromes in the syndrome vector S. For example, if each of the syndromes in the syndrome vector S is "0", the error checking and correcting circuit 208 may determine that the bits do not have any error and then determine that the codeword composed of these bits is the valid codeword; and if one or more syndromes in the syndrome vector S is "1", the error checking and correcting circuit 208 may determine that the bits have the at least one error and then determine that the codeword composed of these bits is not the valid codeword.

FIG. 11 is a schematic diagram illustrating a matrix multiplication according to an exemplary embodiment of the invention.

Referring to FIG. 11, a result of multiplying the parity check matrix 900 by a codeword 1101 is a syndrome vector 1105. Each of the bits in the codeword 1101 corresponds to at least one syndrome in the syndrome vector 1105. For instance, a bit $V_1$ (which is corresponding to a first column of the parity check matrix 900) in the codeword 1101 is corresponding to syndromes $S_1$ and $S_2$; a bit $V_2$ (which is corresponding to a second column of the parity check matrix 900) is corresponding to syndromes $S_1$ and $S_3$; and the rest may be deduced by analogy. If the bit $V_1$ has the error, the syndromes $S_1$ and $S_2$ may be "1"; if the bit $V_2$ has the error, the syndromes S and $S_3$ may be "1"; and the rest may be deduced by analogy. In addition, the first constraint in the parity check matrix 900 is corresponding to the syndrome $S_1$; the second constraint in the parity check matrix 900 is corresponding to the syndrome $S_2$; the third constraint in the parity check matrix 900 is corresponding to the syndrome $S_3$; and the fourth constraint in the parity check matrix 900 is corresponding to the syndrome $S_4$.

If the bits $V_1$ to $V_9$ in the codeword 1101 have no errors, the error checking and correcting circuit 208 can output the bits $V_1$ to $V_9$ in the codeword 1101. If the bits $V_1$ to $V_9$ have the at least one bit, the error checking and correcting circuit 208 executes an iteration decoding procedure on the bits $V_1$ to $V_9$ in order to obtain a plurality of decoded bits. Particularly, before the iteration decoding procedure is executed, the error checking and correcting circuit 208 may obtain weights. Each of the weights is corresponding to one of the bits and one of the syndromes. The weights may be represented by a weight matrix. The weights may also be recorded in a lookup table. The error checking and correcting circuit 208 may execute the iteration decoding procedure according to the weights. Alternatively, in an exemplary embodiment, the operation of obtaining the weights corresponding to each of the bits and each of the syndromes may also be regarded as a part of the iteration decoding procedure, which is not particularly limited in the invention.

FIG. 12 is a schematic diagram illustrating a weight matrix according to an exemplary embodiment of the invention.

Referring to FIG. 12, a weight matrix 1200 records weights $W_{1,1}$ to $W_{4,9}$. Therein, the weight $W_{1,1}$ is corresponding to the bit $V_1$ and the syndrome $S_1$; the weight $W_{1,2}$ is corresponding to the bit $V_2$ and the syndrome $S_1$; the weight $W_{2,1}$ is corresponding to the bit $V_1$ and the syndrome $S_2$; and the rest may be deduced by analogy. A dimension of the weight matrix 1200 is identical to the dimension of parity check matrix 900. For example, the weight matrix 1200 also includes m rows and n columns.

The error checking and correcting circuit 208 calculates a sum of the obtained reliability information matching a check condition among the reliability information and adds a balance information to the sum in order to obtain one weight in the weight matrix 1200. An example of calculating the weight $W_{1,1}$ is provided below.

FIG. 13 is a schematic diagram illustrating correspondence relationships of the codeword, the reliability information, the parity check matrix and the syndromes according to an exemplary embodiment of the invention.

Referring to FIG. 13, it is assumed that the reliability information corresponding to each of the bits $V_1$ to $V_9$ in the codeword 1101 are "0.6", "0.8", "−0.2", "1.3", "−1.5", "0.3", "−1.2", "0.4" and "0.1" in a reliability information vector 1103, respectively. However, the reliability information vector 1103 herein is merely a sample matrix instead of limitation to the invention. In the present exemplary embodiment, the absolute value of each of the reliability information in the reliability information vector 1103 is obtained. Accordingly, the reliability information in the reliability information vector 1103 become "0.6", "0.8", "0.2", "1.3", "1.5", "0.3", "1.2", "0.4" and "0.1", respectively. As the absolute value of the reliability information corresponding to one specific bit being greater, it indicates that the possibility for the errors to occur in the corresponding bit is lower; and as the absolute value of the reliability information corresponding to one specific bit being smaller, it indicates that the possibility for the errors to occur in the corresponding bit is higher. However, in another exemplary embodiment, any logic operation may be executed on each of reliability information in the reliability information vector 1103, which is not particularly limited in the invention. In addition, each of the reliability information in the reliability information vector 1103 is corresponding to one element in each constraint of the parity check matrix 900. For example, as shown in FIG. 13, "0.6" in the reliability information vector 1103 is corresponding to the first elements counted from the left in each of the first constraint to the fourth constraint, "0.8" in the reliability information vector 1103 is corresponding to the second elements counted from the left in each of the first constraint to the fourth constraint, and the rest may be deduced by analogy. Because the weight $W_{1,1}$ in the weight matrix 1200 is corresponding to the bit $V_1$ in the codeword 1101 and the syndrome $S_1$ in the syndrome vector 1105, in the following exemplary embodiments, the bit $V_1$ in the codeword 1101 is also known as a first bit, and the syndrome $S_1$ in the syndrome vector 1105 is also known as a first syndrome, so as to facilitate in explaining how to calculate the weight $W_{1,1}$.

When calculating the weight $W_{1,1}$, the error checking and correcting circuit 208 decides a plurality of reliability information matching the check condition in the reliability information vector 1103 according to the first constraint in the parity check matrix 900. For example, the error checking and correcting circuit 208 may decide the reliability information matching the check condition in the reliability information vector 1103 according to a plurality of elements having values being "1" among the elements included by the first constraint. For example, in this exemplary embodiment, a value of each of the four elements counted from the left in the first constraint is "1", and thus the reliability information matching the check condition in the reliability information vector 1103 are "0.6", "0.8", "0.2" and "1.3", respectively. Thereafter, the error checking and correcting circuit 208 may obtain the sum of the reliability information matching the check condition being "2.9".

In the present exemplary embodiment, each constraint is corresponding to one balance information. The error checking and correcting circuit 208 adds the balance information corresponding to the first constraint to the sum in order to obtain the weight $W_{1,1}$. More specifically, the error checking and correcting circuit 208 may add the balance information corresponding to the first constraint to the sum in order to obtain a first evaluation information and divide the first evaluation information by a second evaluation information in order to obtain the weight $W_{1,1}$.

The error checking and correcting circuit 208 may select the reliability information corresponding to another bit (also known as a second bit) from among the reliability information matching the check condition. Therein, the second bit is different from the first bit. That is, in this exemplary embodiment, the second bit is one of the bits $V_2$ to $V_4$. Particularly, in the present exemplary embodiment, among all values of the reliability information matching the check condition, the value of the selected reliability information corresponding to the second bit is the smallest. Alternatively, in another exemplary embodiment, among all values of the reliability information matching the check condition, the value of the selected reliability information corresponding to the second bit is greater than the value of the reliability information corresponding to the first bit. For example, in the present exemplary embodiment, the value of the reliability information corresponding to the first bit (i.e., the bit $V_1$) is "0.6". Therefore, the error checking and correcting circuit 208 may select the reliability information having the value of "0.2" from among the values "0.8", "0.2" and "1.3" to serve as the reliability information corresponding to the second bit. In other words, in the present exemplary embodiment, the second bit is the bit $V_3$, and the reliability information corresponding to the second bit is "0.2". However, in another exemplary embodiment, the second bit may also be selected according to any conditions, which are not particularly limited in the invention. For example, in an exemplary embodiment, the reliability information matching the check condition may be used as an input to a lookup table or an algorithm, and an output of said lookup table or said algorithm may then be used as the reliability information corresponding to the second bit.

In the present exemplary embodiment, each constraint is corresponding to one scaling factor $\alpha_m$. For example, $\alpha_1$ is corresponding to the first constraint; $\alpha_2$ is corresponding to the second constraint; $\alpha_3$ is corresponding to the third constraint; and $\alpha_4$ is corresponding to fourth constraint. After the reliability information corresponding to the second bit is obtained, the error checking and correcting circuit 208 may multiply the reliability information corresponding to the second bit by the scaling factor $\alpha_1$ in order to obtain the balance information corresponding to the first constraint. Accordingly, the sum of the reliability information matching the check condition may be in balance with a value of the balance information, so as to prevent the value of the balance information from being ignored for being too small. It is worth mentioning that, in the present exemplary embodiment, the scaling factor $\alpha_m$ is an integer or a real number greater than "1". However, in another exemplary embodiment, the scaling factor $\alpha_m$ may also be any real number, which is not particularly limited in the invention. In addition, in another exemplary embodiment, the scaling factor $\alpha_m$ may also be "1". In the present exemplary embodiment, if the scaling factor $\alpha_1$ is "11.36", the error checking and correcting circuit 208 may obtain the first evaluation information being "5.172". In addition, the error checking and correcting circuit 208 may use the reliability information corresponding to the first bit (i.e., the bit $V_1$) to serve as the second evaluation information. That is, in this exemplary embodiment, the second evaluation information is "0.6". Accordingly, by dividing the first evaluation information by the second evaluation information, the evaluation information 208 may obtain the weight $W_{1,1}$ being "8.62". Alternatively, in an exemplary embodiment, the error checking and correcting circuit 208 may obtain the weights $W_{1,1}$ to $W_{4,9}$ in the weight matrix 1200 of FIG. 12 by using an equation (6) provided below.

$$w_{m,n} = \frac{\sum_{i \in N(m)} |y_i| + \alpha_m * y_{m,n}^{min}}{|y_n|} \quad (6)$$

Therein, $$\sum_{i \in N(m)} |y_i|$$

is the sum of the reliability information matching the check condition corresponding to a $m^{th}$ constraint, $$\sum_{i \in N(m)} |y_i| + \alpha_m * y_{m,n}^{min}$$

is the first evaluation information, $|y_n|$ is the second evaluation information, $y_{m,n}^{min}$ is the reliability information corresponding to the second bit, and $\alpha_m * y_{m,n}^{min}$ is the balance information corresponding to the $m^{th}$ constraint.

In an exemplary embodiment, the value of the balance information corresponding to the $m^{th}$ constraint is in positive correlation with a row weight of the $m^{th}$ constraint. For example, the value of the balance information corresponding to the first constraint is in positive correlation with the row weight of the first constraint; the value of the balance information corresponding to the second constraint is in positive correlation with the row weight of the second constraint; and the rest may be deduced by analogy. For instance, the error checking and correcting circuit 208 may decide the row weight of the first constraint according to a number of elements having the values being "1" in the first constraint. For example, in the exemplary embodiment of FIG. 13, there are four elements having the values being "1" in the first constraint, and thus the error checking and correcting circuit 208 may decide that the row weight of the first constraint is "4". By analogy, the row weight of the second constraint is "6", the row weight of the third constraint is "6", and the row weight of the fourth constraint is "4". In addition, in another exemplary embodiment, the value of the balance information corresponding to the $m^{th}$ constraint may also be in negative correlation with or not correlated with the row weight of the $m^{th}$ constraint, which is not particularly limited in the invention.

In an exemplary embodiment, the error checking and correcting circuit 208 may multiply the row weight of the $m^{th}$ constraint by a magnification factor in order to obtain a scaling factor $\alpha_m$ corresponding to the $m^{th}$ constraint. For example, the error checking and correcting circuit 208 may multiply the row weight of the first constraint by a magnification factor in order to obtain a scaling factor $\alpha_1$. For example, the error checking and correcting circuit 208 may calculate an average (also known as a first average) of all the reliability information in the reliability information vector 1103 and obtain a smallest value and a second smallest value of the reliability information from among the corresponding reliability information matching the check condition according to each constraint in the parity check matrix 900. For example, the error checking and correcting circuit 208 may obtain a smallest value and a second smallest value of the reliability information corresponding to the first constraint respectively being "0.2" and "0.6", a smallest value and a second smallest value of the reliability information corresponding to the second constraint respectively being "0.2" and "0.3", a smallest value and a second smallest value of the reliability information corresponding to the third constraint respectively being "0.1" and "0.3", and a smallest value and a second smallest value of the reliability information corresponding to the fourth constraint respectively being "0.1" and "0.2". Thereafter, the error checking and correcting circuit 208 may calculate an average (also known as a second average) of a total of the smallest values and the second smallest values and divides the first average by the second average to obtain the magnification factor. In the present exemplary embodiment, each row weight of the $m^{th}$ constraint is multiplied by the same magnification factor. However, in another exemplary embodiment, each row weight of the $m^{th}$ constraint is multiplied by different magnification factors. In addition, in another exemplary embodiment, the smallest value and the second smallest value of the reliability information may also be selected according to any rules, which are not particularly limited in the invention. Alternatively, in an exemplary embodiment, the error checking and correcting circuit 208 may also obtain the scaling factor $\alpha_m$ by using the an equation (7) provided below.

$$\alpha_m = \text{row\_weight}(m) \times \frac{\text{mean}(|y|)}{\text{mean}(|y^{min}|)} \quad (7)$$

Therein, row_weight(m) is the row weight of the $m^{th}$ constraint in the parity check matrix 900, mean(|y|) is aforesaid first average, and mean($|y^{min}|$) is aforesaid second average. For example, in the present exemplary embodiment, the first average is "0.71" (i.e., (0.6+0.8+0.2+1.3+1.5+0.3+1.2+0.4+0.1)/9=0.71, and the second average is "0.25" (i.e., (0.2+0.2+0.1+0.1+0.6+0.3+0.3+0.2)/9=0.25). Therefore, the obtained scaling factors $\alpha_1$ to $\alpha_4$ are "11.36", "17.04", "11.36" and "17.04", respectively.

Based on above operations, the error checking and correcting circuit 208 can obtain the weights $W_{1,1}$ to $W_{4,9}$ in the weight matrix 1200 of FIG. 12. For example, in the present exemplary embodiment, when calculating the weight $W_{2,1}$, the first bit is the bit $V_1$ and the second bit is the bit $V_3$. According to the second constraint in the parity check matrix 900, the error checking and correcting circuit 208 may decide that the plurality of reliability information matching the check condition are "0.6", "0.2", "1.3", "1.5" "0.3" and "1.2", and the sum thereof is "5.1". Subsequently, assuming that the scaling factor $\alpha_2$ is "17.04", the error checking and correcting circuit 208 may obtain the first evaluation information being "8.508" (i.e., 5.1+(17.04×0.2)), the second evaluation information being "0.6" (i.e., the reliability information corresponding to the first bit), and the weight $W_{2,1}$ being "14.18" (i.e., 8.508/0.6=14.18). Calculations regarding the rest of the weights in the weight matrix 1200 may be calculated according to the same method, which are omitted hereinafter.

FIG. 14 is a schematic diagram illustrating the calculated weight according to an exemplary embodiment of the invention.

Referring to FIG. 14, in the first constraint of the weight matrix 1200, the weight $W_{1,1}$, corresponding to the bit $V_1$ and the syndrome $S_1$, is "8.62"; the weight $W_{1,2}$, corresponding to the bit $V_2$ and the syndrome $S_1$, is "6.47"; the weight $W_{1,3}$, corresponding to the bit $V_3$ and the syndrome $S_1$, is "48.58"; and the weight $W_{1,4}$, corresponding to the bit $V_4$ and the syndrome $S_1$, is "3.45". In the second constraint of the weight matrix 1200, the weight $W_{2,1}$, corresponding to the bit $V_1$ and the syndrome $S_2$, is "14.18"; the weight $W_{2,3}$, corresponding to the bit $V_3$ and the syndrome $S_2$, is "51.06"; the weight $W_{2,4}$, corresponding to the bit $V_4$ and the syndrome $S_2$, is "6.54"; the weight $W_{2,5}$, corresponding to the bit $V_5$ and the syndrome $S_2$, is "5.67"; the weight $W_{2,6}$, corresponding to the bit $V_6$ and the syndrome $S_2$, is "28.36"; the weight $W_{2,7}$, corresponding to the bit $V_7$ and the syndrome $S_2$, is "7.09"; and the rest may be deduced by analogy. It is worth mentioning that, in the present exemplary embodiment, the error checking and correcting circuit 208 may set a part of the weights in the weight matrix 1200 to "0" in correspondence to the elements having the values being "0" in the parity check matrix 900.

FIG. 15 is a schematic diagram illustrating a matrix multiplication according to an exemplary embodiment of the invention.

Referring to FIG. 15, in the iteration decoding procedure, the error checking and correcting circuit 208 may obtain syndrome weight information of the bits $V_1$ to $V_9$ according to the syndromes and the calculated weights. For instance, the error checking and correcting circuit 208 may multiply each of the syndromes by one weight and accumulate a result of multiplying the syndromes by the weight in order to obtain the syndrome weight information. For example, the syndrome weight information of the bit $V_1$ is equal to $W_{1,1}*S_1+W_{2,1}*S_2$, wherein the weights $W_{1,1}$ and $W_{2,1}$ are "8.62" and "14.18" respectively, as illustrated in FIG. 14. In the present exemplary embodiment, based on whether one specific syndrome is "1" or "0", the error checking and correcting circuit 208 may decide whether the value of the weight corresponding to the specific syndrome is greater than 0 or less than 0. For example, if one specific syndrome is "1", the weight corresponding to that specific syndrome is multiplied by "1"; and if one specific syndrome is "0", the weight corresponding to that specific syndrome is multiplied by "−1". It should be noted that, an addition made herein for the syndromes $S_1$ to $S_4$ is a normal addition instead of a modulo-2 addition. In other words, the error checking and correcting circuit 208 may obtain the syndrome weight information corresponding to the bits $V_1$ to $V_9$ by using an equation (8) provided below.

$$E_n = \sum_{m \in N(n)} (2s_m - 1) \left( \frac{\sum_{m \in N(n)} |y_i| + \alpha_m * y_{m,n}^{min}}{|y_n|} \right) \quad (8)$$

Therein, a vector $E_n$ is used to indicate the syndrome weight information of each of the bits $V_1$ to $V_9$.

The error checking and correcting circuit 208 may flip at least one of the bits according to the syndrome weight information of the $V_1$ to $V_9$. For example, the error checking and correcting circuit 208 may flip specific one or more bits from "1" to "0", or from "0" to "1". In an exemplary embodiment, the operation of flipping the bit is also known as bit flipping. Specifically, when each time the iteration decoding procedure is executed, only one bit is flipped in one codeword at most. For example, the value of the syndrome weight information of the flipped bit is greater than the values of the syndrome weight information of the bits which are not flipped. In addition, in another exemplary embodiment, the error checking and correcting circuit 208 may determine whether the syndrome weight information of each of the bits in the codeword 1101 matches a weight condition. For example, the error checking and correcting circuit 208 may determine whether the value of the syndrome weight information of each of the bits is greater than a threshold. If the value of syndrome weight information of one specific bit is greater than the threshold, the error checking and correcting circuit 208 may determine that the syndrome weight information of the specific bit matches the weight condition and then flip the specific bit. In other words, in an exemplary embodiment, the syndrome weight information of the flipped bit is the syndrome weight information matching the weight condition.

Figure 16:
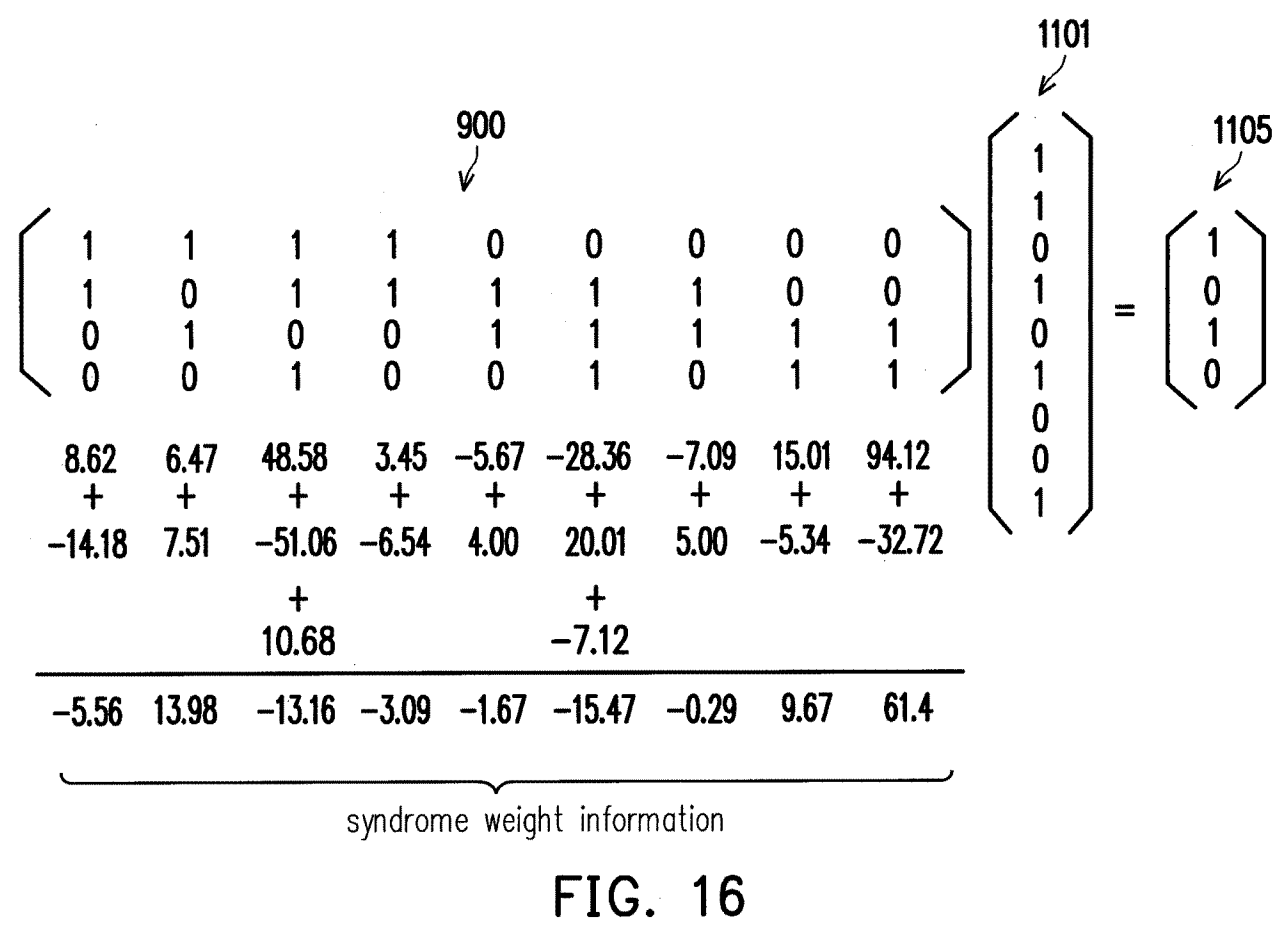

FIG. 16 is a schematic diagram illustrating a syndrome weight information according to an exemplary embodiment of the invention.

Referring to FIG. 16, assuming that the bits $V_1$ to $V_9$ in the codeword 1101 are "1", "1", "0", "1", "0", "1", "0", "0" and "1" respectively and the syndromes in the syndrome vector 1105 are "1", "0", "1" and "0" respectively, the error checking and correcting circuit 208 may obtain the vector $E_n$ according to the equation (8). Said vector $E_n$ is used to indicate that the syndrome weight information of the bits $V_1$ to $V_9$ are "−5.56", "13.98", "−13.16", "−3.09", "−1.67", "−15.47", "−0.29", "9.67" and "61.4", respectively. In this exemplary embodiment, the error checking and correcting circuit 208 may select one specific syndrome weight information with the greatest value (i.e., "15.47") among the obtained absolute value of the syndrome weight information and flip the bit $V_6$ corresponding to that specific syndrome weight information. Thereafter, this iteration decoding procedure may output another codeword having a plurality of bits. For example, the bits may be "1", "1", "0", "1", "0", "0", "0", "0" and "1", respectively. Thereafter, the error checking and correcting circuit 208 may again determine whether the bits have any error. If there is no error, the error checking and correcting circuit 208 then outputs the bits. If there is at least one error, the error checking and correcting circuit 208 may determine whether to execute the iteration decoding procedure again or stop decoding.

In this exemplary embodiment, if the error checking and correcting circuit 208 determines that the codeword 1101 has one or more errors, the error checking and correcting circuit 208 may count a number of iterations (e.g., by adding one to the number of iterations) and determine whether the number of iterations reaches a suspend number. Herein, the suspend number may be 30 times, or more or less for example. If the number of iterations being counted reaches the suspend number, the error checking and correcting circuit 208 may determine that decoding fails and stop decoding. If the number of iterations being counted does not reach the suspend number, the error checking and correcting circuit 208 may execute the iteration decoding procedure again.

Figure 17:
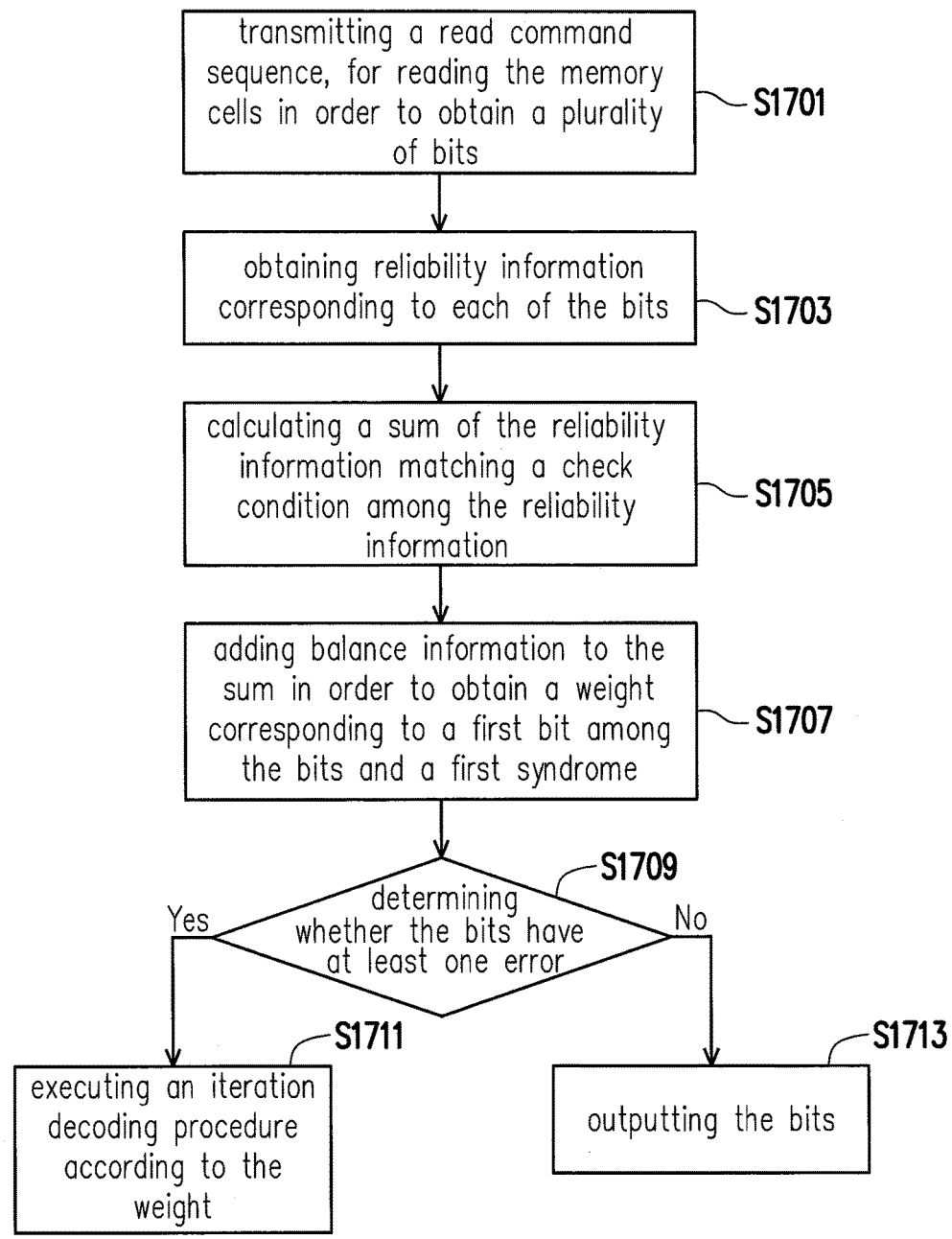
FIG. 17 is a flowchart illustrating a decoding method according to an exemplary embodiment of the invention.

FIG. 17 is a flowchart illustrating a decoding method according to an exemplary embodiment of the invention.

Referring to FIG. 17, first, in step S1701, a read command sequence is transmitted, wherein the read command sequence is configured to read the memory cells in order to obtain a plurality of bits. In step S1703, a plurality of reliability information corresponding to each of the bits are obtained. Next, in step S1705, a sum of a plurality of reliability information matching a check condition among the reliability information is calculated. In step S1707, a balance information is added to the sum in order to obtain a weight, wherein the weight is corresponding to a first bit among the bits and a first syndrome. Thereafter, in step S1709, whether the bits have at least one error is determined. If the bits have the at least one error, in step S1711, an iteration decoding procedure is executed according to the weight. If the bits do not have any error, the bits are outputted in step S1713.

Nevertheless, steps depicted in FIG. 17 are described in detail as above, thus related description is omitted hereinafter. It should be noted that, the steps depicted in FIG. 17 may be implemented as a plurality of program codes or circuits, and the invention is not limited thereto. Moreover, the method disclosed in FIG. 17 may be implemented with reference to above embodiments, or may be implemented separately, the invention is not limited thereto.

In summary, when the bits read from the rewritable non-volatile memory module include one or more errors, the decoding method, the memory control circuit unit and the memory storage device according to the exemplary embodiments of the invention are capable of providing proper weight values for the weights corresponding to different bits in the codeword and different syndromes. As a result, a decoding efficiency of decoding based on the syndrome weight information may be improved.

The previously described exemplary embodiments of the present invention have the advantages aforementioned, wherein the advantages aforementioned not required in all versions of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A decoding method for a memory storage device comprising a rewritable non-volatile memory module which comprises a plurality of memory cells, and the decoding method comprising:
   generating a read command sequence by a memory management circuit and transmitting the read command sequence to the rewritable non-volatile memory module via a memory interface, wherein the read command sequence is configured to read the memory cells in order to obtain a plurality of bits;
   obtaining, by the memory management circuit, a plurality of reliability information, wherein each of the reliability information is corresponding to one of the bits;
   generating, by an error checking and correcting circuit, a sum information of a plurality of reliability information matching a check condition among the reliability information;
   generating, by the error checking and correcting circuit, a first evaluation information according to a balance information and the sum information, wherein the balance information is configured to enlarge the sum information;
   generating, by the error checking and correcting circuit, a weight information indicating whether a first bit among the bits is to be updated according to the first evaluation information and a second evaluation information, wherein the second evaluation information is reliability information corresponding to the first bit, and the weight information reflects a ratio of the first evaluation information and the second evaluation information;
   obtaining, by the error checking and correcting circuit, a plurality of syndromes including a first syndrome corresponding to the weight information according to a parity checking procedure performed on the bits;
   determining, by the error checking and correcting circuit, whether the bits have at least one error according to the syndromes, wherein each of the bits corresponds to at least one of the syndromes;
   if the bits have the at least one error, executing an iteration decoding procedure and flipping at least one of the bits by the error checking and correcting circuit according to the weight, so as to correct the bits; and
   outputting the corrected bits by the error checking and correcting circuit.

2. The decoding method of claim 1,
   wherein the parity checking procedure is executed according to a parity check matrix, and the parity check matrix comprises a plurality of constraints,
   wherein the step of generating the sum information of the reliability information matching the check condition among the reliability information comprises:
      obtaining the reliability information matching the check condition from among the reliability information according to a first constraint corresponding to the first syndrome among the constraints.

3. The decoding method of claim 2, wherein the first constraint comprises a plurality of elements, and the step of obtaining the reliability information matching the check condition from among the reliability information according to the first constraint comprises:
   obtaining the reliability information matching the check condition from among the reliability information according to a plurality of elements having values being "1" among the elements.

4. The decoding method of claim 1, further comprising:
   selecting the reliability information corresponding to a second bit among the bits from among the reliability information matching the check condition, wherein the second bit is different from the first bit; and
   multiplying the reliability information corresponding to the second bit by a scaling factor in order to obtain the balance information.

5. The decoding method of claim 4, wherein, among values of the reliability information matching the check condition, a value of the reliability information corresponding to the second bit is the smallest.

6. The decoding method of claim 4, wherein, among values of the reliability information matching the check condition, a value of the reliability information corresponding to the second bit is greater than a value of the reliability information corresponding to the first bit.

7. The decoding method of claim 1, wherein a value of the balance information is in positive correlation with a row weight of a first constraint corresponding to the first syndrome in a parity check matrix.

8. A memory control circuit unit, for a memory storage device comprising a rewritable non-volatile memory module, wherein the rewritable non-volatile memory module comprises a plurality of memory cells, and the memory control circuit unit comprises:
   a host interface configured to couple to a host system;
   a memory interface configured to couple to the rewritable non-volatile memory module;
   a memory management circuit, coupled to the host interface and the memory interface and configured to generate a read command sequence and to transmit the read command sequence to the rewritable non-volatile memory module via the memory interface, wherein the read command sequence is configured to read the memory cells in order to obtain a plurality of bits; and
   an error checking and correcting circuit, coupled to the memory management circuit and configured to obtain a plurality of reliability information, wherein each of the reliability information is corresponding to one of the bits,
   wherein the error checking and correcting circuit is further configured to generate a sum information of a plurality of reliability information matching a check condition among the reliability information,
   wherein the error checking and correcting circuit is further configured to generate a first evaluation information according to a balance information and the sum information, wherein the balance information is configured to enlarge the sum information,
   wherein the error checking and correcting circuit is further configured to generate a weight information indicating whether a first bit among the bits is to be updated according to the first evaluation information and a second evaluation information, wherein the second evaluation information among the reliability information is the reliability information corresponding to the first bit, and the weight information reflects a ratio of the first evaluation information and the second evaluation information, wherein the error checking and correcting circuit is further configured to obtain a plurality of syndromes including a first syndrome corresponding to the weight information according to a parity checking procedure performed on the bits, and determine whether the bits have at least one error according to the syndromes, wherein each of the bits is corresponding to at least one of the syndromes, if the bits have the at least one error, the error checking and correcting circuit is further configured to execute an iteration decoding procedure and flip at least one of the bits according to the weight, so as to correct the bits, and the error checking and correcting circuit is further configured to output the corrected bits.

9. The memory control circuit unit of claim 8, wherein the parity checking procedure is executed according to a parity check matrix, and the parity check matrix comprises a plurality of constraints, wherein the operation of the error checking and correcting circuit generating the sum information of the reliability information matching the check condition among the reliability information comprises:

the error checking and correcting circuit obtains the reliability information matching the check condition from among the reliability information according to a first constraint corresponding to the first syndrome among the constraints.

10. The memory control circuit unit of claim 9, wherein the first constraint comprises a plurality of elements, and the operation of the error checking and correcting circuit obtaining the reliability information matching the check condition from among the reliability information according to the first constraint comprises:

the error checking and correcting circuit obtains the reliability information matching the check condition from among the reliability information according to a plurality of elements having values being "1" among the elements.

11. The memory control circuit unit of claim 8, wherein the error checking and correcting circuit is further configured to select the reliability information corresponding to a second bit among the bits from among the reliability information matching the check condition, wherein the second bit is different from the first bit, and the error checking and correcting circuit is further configured to multiply the reliability information corresponding to the second bit by a scaling factor in order to obtain the balance information.

12. The memory control circuit unit of claim 11, wherein, among values of the reliability information matching the check condition, a value of the reliability information corresponding to the second bit is the smallest.

13. The memory control circuit unit of claim 11, wherein, among values of the reliability information matching the check condition, a value of the reliability information corresponding to the second bit is greater than a value of the reliability information corresponding to the first bit.

14. The memory control circuit unit of claim 8, wherein a value of the balance information is in positive correlation with a row weight of a first constraint corresponding to the first syndrome in a parity check matrix.

15. A memory storage device, comprising:
a connection interface unit configured to couple to a host system;
a rewritable non-volatile memory module comprising a plurality of memory cells; and
a memory control circuit unit, coupled to the connection interface unit and the rewritable non-volatile memory module, wherein the memory control circuit unit is configured to generate a read command sequence and transmit the read command sequence to the rewritable non-volatile memory module via a memory interface, wherein the read command sequence is configured to read the memory cells in order to obtain a plurality of bits, wherein the memory control circuit unit is further configured to obtain a plurality of reliability information, wherein each of the reliability information is corresponding to one of the bits, wherein the memory control circuit unit is further configured to generate a sum information of a plurality of reliability information matching a check condition among the reliability information, wherein the memory control circuit unit is further configured to generate a first evaluation information according to a balance information and the sum information, wherein the balance information is configured to enlarge the sum information, wherein the memory control circuit unit is further configured to generate a weight information indicating whether a first bit among the bits is to be updated according to the first evaluation information and a second evaluation information, wherein the second evaluation information among the reliability information is the reliability information corresponding to the first bit, and the weight information reflects a ratio of the first evaluation information and the second evaluation information, wherein the memory control circuit unit is further configured to obtain a plurality of syndromes including a first syndrome corresponding to the weight information according to a parity checking procedure performed on the bits, and determine whether the bits have at least one error according to the syndromes, wherein each of the bits is corresponding to at least one of the syndromes, and if the bits have the at least one error, the memory control circuit unit is further configured to execute an iteration decoding procedure and flip at least one of the bits according to the weight, so as to correct the bits, wherein the memory control circuit unit is further configured to output the corrected bits.

16. The memory storage device of claim 15, wherein the parity checking procedure is executed according to a parity check matrix, and the parity check matrix comprises a plurality of constraints, wherein the operation of the memory control circuit unit generating the sum information of the reliability information matching the check condition among the reliability information comprises:

the memory control circuit unit obtains the reliability information matching the check condition from among the reliability information according to a first constraint corresponding to the first syndrome among the constraints.

17. The memory storage device of claim 16, wherein the first constraint comprises a plurality of elements, and the operation of the memory control circuit unit obtaining the reliability information matching the check condition from among the reliability information according to the first constraint comprises:
  the memory control circuit unit obtains the reliability information matching the check condition from among the reliability information according to a plurality of elements having values being "1" among the elements.

18. The memory storage device of claim 15, wherein the memory control circuit unit is further configured to select the reliability information corresponding to a second bit among the bits from among the reliability information matching the check condition, wherein the second bit is different from the first bit, and
  the memory control circuit unit is further configured to multiply the reliability information corresponding to the second bit by a scaling factor in order to obtain the balance information.

19. The memory storage device of claim 18, wherein, among values of the reliability information matching the check condition, a value of the reliability information corresponding to the second bit is the smallest.

20. The memory storage device of claim 18, wherein, among values of the reliability information matching the check condition, a value of the reliability information corresponding to the second bit is greater than a value of the reliability information corresponding to the first bit.

21. The memory storage device of claim 15, wherein a value of the balance information is in positive correlation with a row weight of a first constraint corresponding to the first syndrome in a parity check matrix.

* * * * *